US011532348B2

(12) United States Patent
Yu et al.

(10) Patent No.: US 11,532,348 B2
(45) Date of Patent: Dec. 20, 2022

(54) POWER MANAGEMENT ACROSS MULTIPLE PACKAGES OF MEMORY DIES

(71) Applicant: Micron Technology, Inc., Boise, ID (US)

(72) Inventors: Liang Yu, Boise, ID (US); Jeremy Wayne Butterfield, Meridian, ID (US); Jeremy Binfet, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/110,128

(22) Filed: Dec. 2, 2020

(65) Prior Publication Data
US 2022/0172767 A1 Jun. 2, 2022

(51) Int. Cl.
*G11C 11/4074* (2006.01)
*G11C 11/4076* (2006.01)
*G11C 5/14* (2006.01)
*G11C 5/06* (2006.01)
*G11C 11/409* (2006.01)

(52) U.S. Cl.
CPC .......... *G11C 11/4074* (2013.01); *G11C 5/06* (2013.01); *G11C 5/14* (2013.01); *G11C 11/409* (2013.01); *G11C 11/4076* (2013.01)

(58) Field of Classification Search
CPC ............ G11C 11/4074; G11C 11/4076; G11C 11/409
USPC ............................................. 365/226, 185.17
See application file for complete search history.

(56) References Cited

U.S. PATENT DOCUMENTS

| 10,712,955 | B2* | 7/2020 | Jeon .................. G11C 16/32 |
| 2004/0168043 | A1 | 8/2004 | Keller et al. |
| 2007/0113058 | A1 | 5/2007 | Tran et al. |
| 2014/0195734 | A1* | 7/2014 | Ha et al. ............. G06F 3/0625 |
| 2020/0312412 | A1* | 10/2020 | Tanaka ................. G11C 16/30 |
| 2021/0217482 | A1* | 7/2021 | Choi .................. G11C 11/4074 |

(Continued)

FOREIGN PATENT DOCUMENTS

| CN | 114579498 A | 6/2022 |
| CN | 114582409 A | 6/2022 |

OTHER PUBLICATIONS

"Yu, Liang, et al., Peak Power Management in a Memory Device, U.S. Appl. No. 17/110,103, dated Dec. 2, 2020, 60 pgs.", 60 pgs.

*Primary Examiner* — Connie C Yoha
(74) *Attorney, Agent, or Firm* — Schwegman Lundberg & Woessner, P.A.

(57) ABSTRACT

A variety of applications can include multiple memory die packages configured to engage in peak power management (PPM) across the multiple packages of memory dies. A communication line coupled to each memory die in the multiple memory die packages can be used to facilitate the PPM. A global management die can start a communication sequence among the multiple memory die packages to share a current budget across the multiple memory die packages by driving a signal on the communication line. Local management dies can use the received signal having clock pulses driven by the global management die on the communication line to engage in the PPM. To engage in global PPM, each memory die can be structured, to be selected as the global management die or a local management die, with one or more controllers to interface with the multiple memory die packages and to handle current budget limits.

20 Claims, 8 Drawing Sheets

(56) References Cited

U.S. PATENT DOCUMENTS

2021/0248032 A1\* 8/2021 Kang ................. G06F 11/1068
2022/0171546 A1 6/2022 Yu et al.

\* cited by examiner

POWER MANAGEMENT ACROSS MULTIPLE PACKAGES OF MEMORY DIES

FIELD OF THE DISCLOSURE

Embodiments of the disclosure relate generally to memory devices and operation of memory devices and, more specifically, to managing power budgets of memory devices.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line.

In some NAND memory dies, peak power management (PPM) logic is implemented to control peak power consumption in the memory die. Existing PPM designs focus on memory array operations, such as erase, program array, read array, or independent wordline reads (iWL). The PPM logic can be implemented with multiple memory dies in a memory die package. However, on a solid state drive (SSD), there can be multiple memory die packages in a memory system of the SSD to achieve high density SSD design. The multiple memory die packages can be multiple NAND memory die packages. Conventional PPM designs for NAND memory dies target communication among the NAND memory dies in the same package for PPM operations. Memory systems having multiple NAND memory die packages may not be able to avoid exceeding a peak power system budget or voltage drop in a power delivery network (PDN), when multiple memory die packages reach their individual largest peaks at the same time.

In some conventional SSD designs, a number of NAND memory dies are configured in a PPM group. For example, a sixteen die package (16 DP) can be arranged as a four channel package with four memory dies per channel. In this arrangement, the four NAND memory dies of each channel can form one PPM group for operations in the memory die package. With a conventional PPM that works for four dies in one channel in one package, there can be collisions with respect to power budget with four memory dies in a channel from another memory die package in the memory system. Peak energy is not staggered across multiple packages such that there is a probability that the peak energy from two or more memory die packages can overlap, exceeding the total energy budget for the memory system. This reduces the PPM efficiency in the memory system. In addition, in PPM performance tuning, tuning using NAND PPM firmware considers the worst case occurring in the memory system, even if the probability of such occurrence is very small. Enhancements in PPM capability across multiple memory die packages can aid in providing efficiency to control peak power or PDN voltage drop.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
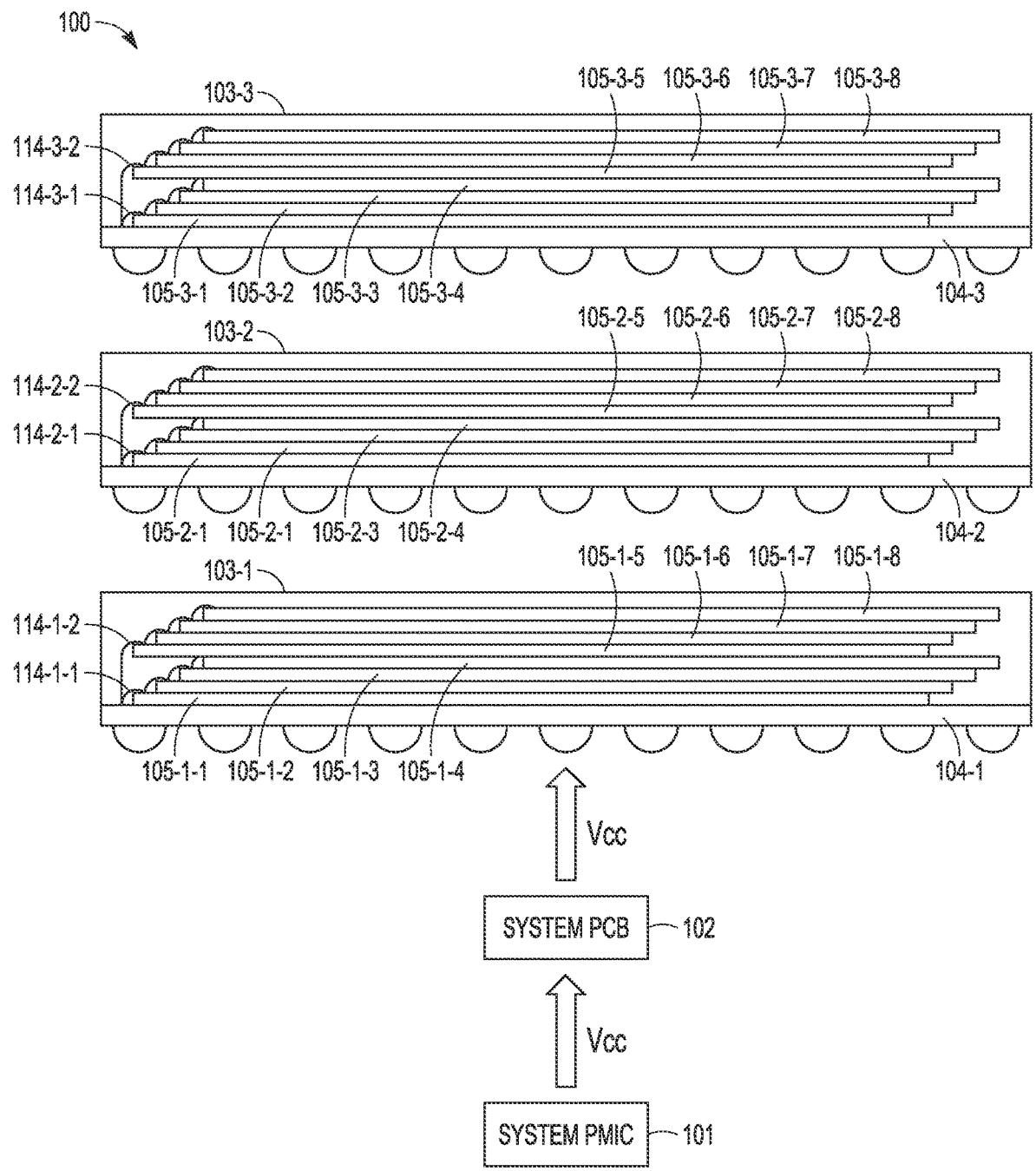
FIG. 1 illustrates an example system having multiple memory die packages arranged with respect to a system power management integrated circuit that provides supply voltage to the memory die packages via a system printed circuit board, in accordance with various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Both NOR and NAND flash architecture semiconductor memory arrays of flash memory devices are accessed through decoders that activate specific memory cells by selecting an access line (WL) coupled to gates of specific memory cells. In a NOR architecture semiconductor memory array, once activated, the selected memory cells place their data values on data lines, causing different currents to flow depending on the state at which a particular cell is programmed. In a NAND architecture semiconductor memory array, a relatively high bias voltage is applied to a drain-side select gate (SGD) line. Access lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows in the line between the source line and the data line through each series-coupled group, restricted only by the selected memory cells of each group, placing current encoded data values of selected memory cells on the data lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein, in its broader context, to refer to any memory cell(s) that can store more than one bit of data per cell (i.e., that can represent more than two programmed states). Herein, a memory cell that can store two bits of data per cell (e.g., one of four programmed states) can be referred to as a duo-level cell (DLC). A triple-level cell (TLC) can refer to a memory cell that can store three bits of data per cell (e.g., one of eight programmed states). A quad-level cell (QLC) can store four bits of data per cell, and a penta-level cell (PLC) can store 5 bits of data per cell.

In a conventional NAND memory device, a PPM feature of the memory device is implemented to mitigate peak power constraints or PDN voltage drop issues of multiple memory dies in a single memory die package, when the multiple memory dies draw peaks in current at the same time in operations such as read, program, and erase for example. A memory die package is a package having one or more memory dies, where the one or more memory dies communicate with host devices, such as, but not limited to, processing devices, or other electronic components exterior to the memory die package through contacts of the memory die package that include positioning on an external surface of the memory package. Each memory die can include pads for power, ground, input/output (IO) bus, command, address, and other signals to operate the memory die. These pads of the memory die can be wire bonded to a substrate, which is effectively a small printed circuit board within the memory die package, that then takes routes signals to a specific package contacts on the memory die package to mount the memory die to a printed circuit board (PCB). The package contacts, which are exterior-oriented contacts, can be implemented as a ball grid array (BGA) or other type of electrically conductive pin used to provide signal paths to and from integrated circuits, such as memory dies, within the package in which these exterior oriented contacts are embedded.

In a NAND memory die package, the PPM of a memory die can communicate between memory dies of the same memory die package through internal clock (ICLK) and communication (HC) lines within the memory die package. The PPM logic management of a memory die can automatically reduce the draw of peak current by the memory die or delay a portion of an operation's algorithm to stagger peak current draws by concurrent operations from multiple dies of the memory die package. The PPM logic management can be implemented as a manager for predictive peak power management (P-PPM).

Digital P-PPM is a mechanism that is used to track peak power consumption by controller/firmware/logic and to provide emphasis on efficiency of the controller/firmware/logic. Predictive PPM (P-PPM) can be implemented within a physical memory die package having multiple memory dies. The physical memory die package can include two communication lines within the package. In a NAND memory die package, the two communication lines can be structured as ICLK and HC paths using token ring communication on all memory dies of the memory die package. This token ring communication can be used to set a current limit for the memory die package such that at no point in time can the peak currents in the memory dies in the memory die package exceed the current limit. The P-PPM of a memory die in the memory die package communicates to each of the other memory dies, when it has the token to communicate, how much current it is currently consuming in its algorithm. These communications among the memory die of the memory die package allow a memory die to react to other memory dies of the memory die package running at their maximum limit by pause operations that use additional current and wait until that current budget is available. When communication from all the other memory die indicate that the current budget is available, the paused memory die can proceed forward with its algorithm to perform operations that use additional current. The P-PPM operates with a token ring communication to keep the memory die package under its peak current budget. This allows all memory die of the memory die package to operate all memory dies with a mechanism to determine if there's going to be an overlap of peak current and, in response to the determination, delay that portion of the operations so that the peak current budget for the memory die package is not exceed. The efficiency of fully utilizing the maximum number of memory die in operation of the memory die package outweighs delaying a timed programming of a memory die of the memory die package.

In various embodiments, a memory die package is structured with one or more exterior electrically conductive package contacts to connect to a communication line to couple to other similarly structured memory die packages to communicate across these different memory die packages to affect PPM among these different memory die packages. A selected contact pad of each memory die of each memory die package can be coupled to a selected output package contact of each respective memory die package with each selected package contact coupled to the communication line. With memory die packages structured in this manner. PPM control of a memory system of multiple memory die packages can increase the efficiency of peak power usage of the memory system or power rail PDN control of the memory system.

For example, the HC and ICLK lines internal to a NAND memory die package can be bonded to package balls of the NAND memory die package that include portions on an exterior surface of the NAND memory die package for electrically coupling with devices external to the NAND memory die package. The internal bonding to HC and ICLK die pads can be made via a substrate within the NAND memory die package, where the substrate is used to mount one or more memory dies and provide electrical paths for the operation of these memory dies. With NAND memory die packages structured in this manner, NAND PPM control of a memory system of multiple memory die packages can increase the efficiency of peak power usage of the memory system or power rail PDN control of the memory system. Such an expansion of a PPM feature of a memory die to multiple memory die packages of one or more memory dies to improve efficiency can be implemented with respect to packages for other types of memory dies.

In various embodiments, a global PPM or global P-PPM can be implemented to provide PPM features across multiple memory die packages structured for operation in memory die packages and to provide PPM global communication. The memory die packages can be NAND memory die packages, with each memory die package having one or more NAND memory dies. In each such NAND memory die package, each of the ICLK and HC pads of all the NAND memory dies can be connected together and bonded to two package contacts, such as package balls, to provide signals to and from other NAND memory die packages. In a printed circuit board (PCB) of a system, such as but not limited to a memory system, an ICLK signal path and a HC signal path can be connected across a target set of memory die packages. Within each NAND memory die package, the ICLK and HC output buffers of the NAND memory dies can be tuned to make the output buffers capable of driving signals through memory die packages. The tuning can take into consideration system PCB loading and other package loading.

The multiple memory die packages can be implemented with one memory die of one of the memory die packages being designated as a global management die (GMD) for the memory dies of the set of multiple memory die packages. The GMD is the management die for the multiple memory die packages. Each memory die package can include one memory die being designated as a local management die (LMD) for the memory dies of the respective memory die package. For the memory die package containing the GMD, the GMD can also be the LMD for the memory die package. Alternatively, the memory die package containing the GMD can have another memory die of the memory die package set as the LMD of the memory die package. A processing device of a system using the multiple die packages can set a memory die in a memory die package of the multiple die packages as a GMD with GMD configurations, and can set the other memory dies in the selected memory die package as non-management dies with non-management die configurations. The processing device can set a memory die in each of the other memory die packages of the multiple die packages as a LMD with LMD configurations, and can set the other memory dies in the memory die packages as a non-management dies with non-management die configurations. Setting memory dies as non-management memory dies in each memory die package can automatically be implemented with the selection of one memory die as a GMD or LMD in the respective memory die package. Such automatic setting can be made within the non-management memory die. A non-management memory die is a follower die in a memory die package with respect to the GMD or LMD in the memory die package. The GMD, LMD, and the non-management memory dies can be implemented with a number of features for PPM capability in the memory system in which multiple memory die packages containing these memory dies are implemented. System components can be adjusted to provide compatibility among different memory die package and memory die products. For example in a NAND memory system, an external weak pull-up can be added in a PCB of a memory system to a HC signal bus in the PCB for pull up capability of NAND memory dies of the NAND memory system.

Memory die and memory die packages structured for PPM communication, as taught herein, can expand peak power management to multiple memory die packages, to support system concurrent operations of memory dies from different memory die packages. Such architectures for memory dies and memory die packages can improve the system peak power or PDN voltage drop control efficiency of a system by preventing collisions of high peak current events from dies of different memory die packages. In adjustments of operational instructions, such as firmware, with respect to memory die program or erase operations, adjustments for worst case operation due to such collisions can be avoided.

FIG. 1 illustrates an embodiment of an example system 100 having multiple memory die packages 103-1, 103-2, and 103-3 arranged with respect to a system power management integrated circuit (PMIC) 101 that provides supply voltage Vcc to the memory die packages 103-1, 103-2, and 103-3 via a system PCB 102. Though three memory die packages are shown, there can be two or more memory die packages. The system PMIC 101 can contain a low drop-out (LDO) voltage regulator and bulk converter to provide Vcc. A LDO regulator can help maintain regulation with small differences between supply voltage and load voltage. The system PCB 102 can contain bulk and decoupling capacitors.

The memory die package 103-1 includes memory dies 105-1-1, 105-1-2, 105-1-3, 105-1-4, 105-1-5, 105-1-6, 105-1-7, and 105-1-8 located on a substrate 104-1 that can act as in internal PCB in the memory die package 103-1. Though eight memory dies are shown, a memory die package can include more or less than eight memory dies. The memory dies 105-1-1, 105-1-2, 105-1-3, 105-1-4, 105-1-5, 105-1-6, 105-1-7, and 105-1-8 can be arranged as two levels or sets of memory dies. A first set can include memory dies 105-1-1, 105-1-2, 105-1-3, and 105-1-4, coupled to the substrate 104-1 by wire bonds such as a wire bond 114-1-1, with the substrate 104-1 providing electrical conductivity to the system PCB 102. Wire bonds such as the wire bond 114-1-1 can provide a channel for operation of the memory dies 105-1-1, 105-1-2, 105-1-3, and 105-1-4. A second set can include memory dies 105-1-5, 105-1-6, 105-1-7, and 105-1-8 coupled to the substrate 104-1 by wire bonds such as a wire bond 114-1-2, with the substrate 104-1 providing electrical conductivity to the system PCB 102. Wire bonds such as the wire bond 114-1-2 can provide another channel for operation of the memory dies 105-1-5, 105-1-6, 105-1-7, and 105-1-8.

Vcc can be supplied to the memory dies 105-1-1, 105-1-2, 105-1-3, 105-1-4, 105-1-5, 105-1-6, 105-1-7, and 105-1-8. Current for cache operations and memory operations on each of the memory dies 105-1-1, 105-1-2, 105-1-3, 105-1-4, 105-1-5, 105-1-6, 105-1-7, and 105-1-8 can be provided from components of each memory die coupled to Vcc external pads and Vcc wire bonds, which are sources of resistance. As a result of such resistances, there can be voltage drops between cascades of the memory dies, which can affect the current available for cache and memory array operations of the memory dies at different cascade levels. The management of current budgets among the memory dies 105-1-1, 105-1-2, 105-1-3, 105-1-4, 105-1-5, 105-1-6, 105-1-7, and 105-1-8 can be handled by PPM logic management on each memory die to share current budget among the memory dies 105-1-1, 105-1-2, 105-1-3, 105-14, 105-1-5, 105-1-6, 105-1-7, and 105-1-8 of memory die package 103-1.

The memory die package 103-2 includes memory dies 105-2-1, 105-2-2, 105-2-3, 105-2-4, 105-2-5, 105-2-6, 105-2-7, and 105-2-8 located on a substrate 104-2 that can act as in internal PCB in the memory die package 103-2. Though eight memory dies are shown, a memory die package can include more or less than eight memory dies. The memory dies 105-2-1, 105-2-2, 105-2-3, 105-2-4, 105-2-5, 105-2-6, 105-2-7, and 105-2-8 can be arranged as two levels or sets of memory dies. A first set can include memory dies 105-2-1, 105-2-2, 105-2-3, and 105-2-4, coupled to the substrate 104-2 by wire bonds such as wire bond 114-2-1, with the substrate 104-2 providing electrical conductivity to the system PCB 102. Wire bonds such as the wire bond 114-2-1 can provide a channel for operation of the memory dies 105-2-1, 105-2-2, 105-2-3, and 105-2-4. A second set can include memory dies 105-2-5, 105-2-6, 105-2-7, and 105-2-8 coupled to the substrate 104-2 by wire bonds such as wire bond 114-2-2, with the substrate 104-2 providing electrical conductivity to the system PCB 102. Wire bonds such as the wire bond 114-2-2 can provide another channel for operation of the memory dies 105-2-5, 105-2-6, 105-2-7, and 105-2-8.

Vcc is supplied to the memory dies 105-2-1, 105-2-2, 105-2-3, 105-2-4, 105-2-5, 105-2-6, 105-2-7, and 105-2-8. Current for cache operations and memory operations on each of the memory dies 105-2-1, 105-2-2, 105-2-3, 105-2-4, 105-2-5, 105-2-6, 105-2-7, and 105-2-8 can be provided from components of each memory die coupled to Vcc external pads and Vcc wire bonds, which are sources of resistance. As a result of such resistances, there can be voltage drops between cascades of the memory dies, which can affect the current available for cache and memory array operations of the memory dies at different cascade levels. The management of current budgets among the memory dies 105-2-1, 105-2-2, 105-2-3, 105-2-4, 105-2-5, 105-2-6, 105-2-7, and 105-2-8 can be handled by PPM logic management on each memory die to share current budget among the memory dies 105-2-1, 105-2-2, 105-2-3, 105-2-4, 105-2-5, 105-2-6, 105-2-7, and 105-2-8 of memory die package 103-2.

The memory die package 103-3 includes memory dies 105-3-1, 105-3-2, 105-3-3, 105-3-4, 105-3-5, 105-3-6, 105-3-7, and 105-3-8 located on a substrate 104-3 that can act as in internal PCB in the memory die package 103-3. Though eight memory dies are shown, a memory die package can include more or less than eight memory dies. The memory dies 105-3-1, 105-3-2, 105-3-3, 105-3-4, 105-3-5, 105-3-6, 105-3-7, and 105-3-8 can be arranged as two levels or sets of memory dies. A first set can include memory dies 105-3-1, 105-3-2, 105-3-3, 105-3-4, coupled to the substrate 104-3 by wire bonds such as wire bond 114-3-1, with the substrate 104-3 providing electrical conductivity to the system PCB 102. Wire bonds such as the wire bond 114-3-1 can provide a channel for operation of the memory dies 105-3-1, 105-3-2, 105-3-3, and 105-3-4. A second set can include memory dies 105-3-5, 105-3-6, 105-3-7, and 105-3-8 coupled to the substrate 104-3 by wire bonds such as wire bond 114-3-2, with the substrate 104-3 providing electrical conductivity to the system PCB 102. Wire bonds such as the wire bond 114-3-2 can provide another channel for operation of the memory dies 105-3-5, 105-3-6, 105-3-7, and 105-3-8.

Vcc is supplied to the memory dies 105-3-1, 105-3-2, 105-3-3, 105-3-4, 105-3-5, 105-3-6, 105-3-7, and 105-3-8. Current for cache operations and memory operations on each of the memory dies memory dies 105-3-1, 105-3-2, 105-3-3, 105-3-4, 105-3-5, 105-3-6, 105-3-7, and 105-3-8 can be provided from components of each memory die coupled to Vcc external pads and Vcc wire bonds, which are sources of resistance. As a result of such resistances, there can be voltage drops between cascades of the memory dies, which can affect the current available for cache and memory array operations of the memory dies at different cascade levels. The management of current budgets among the memory dies 105-3-1, 105-3-2, 105-3-3, 105-3-4, 105-3-5, 105-3-6, 105-3-7, and 105-3-8 can be handled by PPM logic management on each memory die to share current budget among the memory dies 105-3-1, 105-3-2, 105-3-3, 105-3-4, 105-3-5, 105-3-6, 105-3-7, and 105-3-8 of memory die package 103-3.

In the example of FIG. 1, each of the memory die packages of memory dies has two channels that can be operated in parallel. In other examples, the stacked memory devices may be interconnected through through-substrate-vias ("TSVs"); with selected dies in the stack connected to operate as separate channels. In some such examples, the stacked die TSVs of each memory die package can connect with contacts on or within the substrate of each respective memory die package, or with a logic interface die (or assembly) between the substrate of a memory die package and the stacked dies of the memory die package.

The architecture of the system 100 can include the memory dies and the memory die packages structured for PPM communication among the memory die packages of system 100. Each memory die of a memory die package can be internally bonded to a number of package contacts of the memory die package and these package contacts can be coupled with package contacts of the other memory die packages of system 100 to realize PPM communication associated with peak power management among the multiple memory die packages. Each memory die of the memory die packages of system 100 can include a PPM manager. The PPM manager can be implemented as a manager for predictive peak power management (P-PPM).

Figure 2:
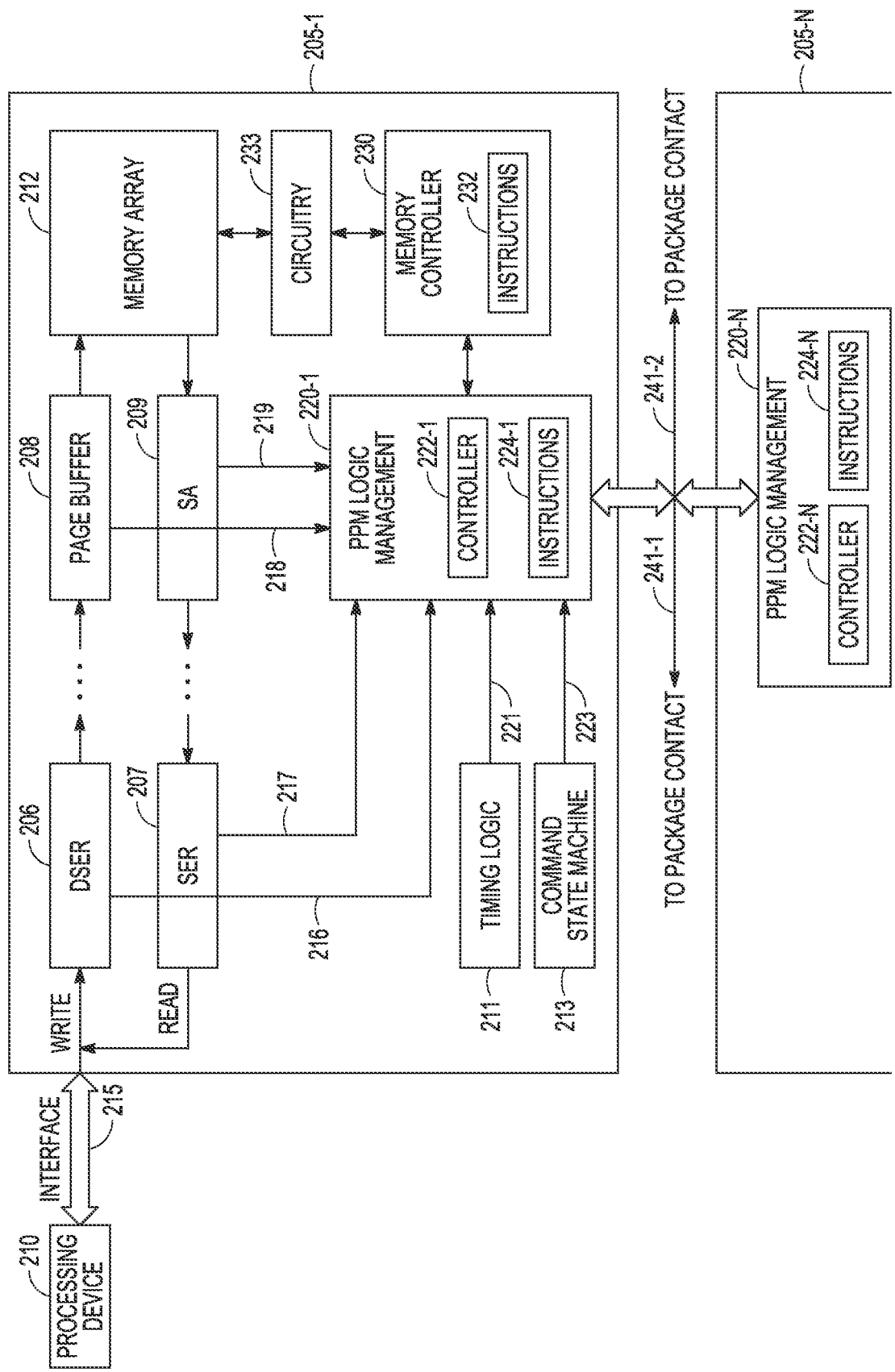
FIG. 2 illustrates an example memory die coupled to a processing device via an interface, in accordance with various embodiments.

FIG. 2 illustrates an embodiment of an example memory die 205-1 coupled to a processing device 210 via an interface 215. Memory die 205-1 is also coupled to another memory die 205-N. Though not shown, memory die 205-1 can be coupled to other memory dies. These memory dies can be NAND memory dies, with interface 215 being an Open NAND Flash Interface (ONFI). The memory die 205-1, memory die 205-N, and other memory dies coupled to the memory die 205-1 can be arranged in a memory die package such as memory die package 103-1, 103-2, or 103-3 of FIG. 1. The memory die package is not shown in FIG. 2 for ease of discussion of memory die 205-1. The processing device 210 can be external to the memory die package that contains the memory die 205-1. Processing device 210 can include processing circuitry having one or more processors, where the processing device 210 is configured to perform operations to write to and read from the memory die 205-1 and other memory die associated with the memory die 205-1. The processing device 210 can be oriented for user devices to interact with the memory die 205-1 and other memory die associated with the memory die 205-1.

The memory die 205-1 can include, among other components, deserializer circuitry 206, a page buffer 208, a memory array 212, a memory controller 230 with associated with instructions 232, circuitry 233 coupling the memory array 212 to the memory controller 230, a sense amplifier 209, serializer circuitry 207, timing logic 211, PPM logic management 220-1 having a controller 222-1 with associated instructions 224-1. The circuitry 233 can be implemented with CMOS (complementary metal oxide semiconductor) circuitry or its equivalent. Other components of the memory die 205-1 are not shown for ease of discussion of components and functions to control current budget for cache operations and memory array operations of the memory die 205-1. The components and functions to control the control budget can be implemented with respect to the PPM logic management 220-1.

In addition to the controller 222-1 and instructions 224-1, the PPM logic management 220-1 can include logic circuits and registers. The logic circuits and registers can be used in receiving signals from other components of the memory die 205-1. The controller 222-1 can include processing circuitry, including one or more processors, and can be configured to perform peak power management operations for the memory die 205-1 by executing instructions 224-1. Execution operations of the PPM logic management 220-1 can include communicating current budgets with other PPM logic management components of other memory die located in the memory die package with memory die 205-1. For example, memory die 205-N can include a controller 222-N and instructions 224-N that can operate similar to controller 222-1 and instructions 224-1 of memory die 205-1. The controller 222-1 can be a dedicated controller for the PPM logic management 220-1. Alternatively, the controller 222-1 can be the controller for the memory die 205-1 that handles operations of the memory array 212 with the instructions 224-1 dedicated to conduct peak power management for the memory die 205-1. The PPM logic management 220-1 can be a dedicated state machine that handles all PPM related items.

For a write operation to the memory array 212 of the memory die 205-1, data received at the deserializer circuitry 206 as serial data in from the interface 215 is output as parallel data on a data path to the page buffer 208 for programming the memory array 212. Additional circuitry can be located along the data path from the deserializer circuitry 206 to the page buffer 208. The memory array 212 is relatively slow to program, compared to propagation speed in the memory die 205-1. In addition, with the memory array 212 arranged as a memory array with MLCs, more operations are involved with programming the memory array 212. To address the complexity of programming data into the memory array 212, data is received and held in the page buffer 208 as other data is loaded into the memory array 212. The page buffer 208 provides a cache to allow loading in additional data ahead of the data transfer for the next programming of data into the memory array 212 to enhance performance. Associated with the cache operation of the page buffer 208 is consumption of current using power provided to the memory die 205-1 using Vcc.

For a read operation from the memory array 212 of the memory die 205-1, data is provided to the sense amplifier 209 from the memory array 212. Data is held in the sense amplifier 209 as data is loaded from the memory array 212. The sense amplifier 209 provides a cache to allow collecting of data ahead of data transfer from the memory die 205-1. Data loaded into the sense amplifier 209 is sent to the serializer circuitry 207, which can serialize the data for output to the interface 215. Additional circuitry can be located along the data path from the sense amplifier 209 to the serializer circuitry 207. Associated with the cache operation of the sense amplifier 209 is consumption of current using power provided to the memory die 205-1.

For write and read cache operations, a command state machine or circuits along a data path between the interface 215 and the memory array 212 can provide signals to be monitored by the PPM logic management 220-1. The use of the signals with respect to write and read cache operations in the memory die 205-1 can provide a mechanism to pass information of current usage in the write and read cache operations to the PPM logic management 220-1. The PPM logic management 220-1 can update parameters that it uses and update the status of cache operations and memory array operations with respect to current usage. The PPM logic management 220-1 can be implemented as logic management for P-PPM. The use of P-PPM features can be implemented with multiple-die configurations with various operations running on the multiple dies simultaneously. A P-PPM manager can communicate within a memory die and halt the operation or go to low peak power mode if the total peak power is more than expected. The PPM logic management 220-1 can communicate with other memory dies, such as memory die 205-N, to share information regarding current budget for cache and memory array operations. Based on updating the current budget using the signals, the PPM logic management 220-1 can provide feedback to the memory controller 230 to control write and read operations within the memory array 212.

For a write cache operation, for example, the deserializer circuitry 206 can be used to identify a start of the write cache operation, and the page buffer 208 can be used to identify a stop of the write cache operation. Identification of a first specified event in a timing pattern input to the deserializer circuitry 206 can be used to generate a signal from the deserializer circuitry 206 to the PPM logic management 220-1 along a path 216. This signal provides a first flag received from the data path identifying the start of the write cache operation on the data of the write operation. Identification of a second specified event in the timing pattern input to the page buffer 208 can be used to generate a signal from the page buffer 208 to the PPM logic management 220-1 along a path 218. This signal provides a second flag received from the data path identifying the end of the write cache operation on the data of the write operation. Comparison circuits can be used to identify the occurrence of the first and second specified events. The timing logic 211 of the memory die 205-1 can be used as a monitor of the cache operation by providing a signal along path 221 to the PPM logic management 220-1. The timing logic 211 can be used to identify an interface timing mode for data-in in the write cache operation. Alternatively, a command state machine 213 can be used as a monitor of the cache operation by providing a signal along path 223 to the PPM logic management 220-1. The determination of start and stop cache operations for write operations is not limited by the use of the deserializer circuitry 206 and the page buffer 208. Other circuits in the data path form the interface 215 to the memory array 212 can be used to participate in the PPM of the memory die 205-1.

For a read cache operation, for example, the sense amplifier 209 can be used to identify a start of the read cache operation, and the serializer circuitry 207 can be used to identify a stop of the read cache operation. Identification of a first specified event in a timing pattern to the memory die 205-1 can be used to generate a signal from the sense amplifier 209 to the PPM logic management 220-1 along a path 219. This signal provides a first flag received from the data path identifying the start of the read cache operation on the data of the read operation. Identification of a second specified event in the timing pattern input to the memory die 205-1 can be used to generate a signal from the serializer circuitry 207 to the PPM logic management 220-1 along a path 217. This signal provides a second flag received from the data path identifying the end of the read cache operation on the data of the read operation. Comparison circuits can be used to identify the occurrence of the first and second specified events. The timing logic 211 of the memory die 205-1 can be used as a monitor of the cache operation by providing a signal along path 221 to the PPM logic management 220-1. The timing logic 211 can be used to identify an interface timing mode for data-out in the read cache operation. Alternatively, a command state machine 213 can be used as a monitor of the cache operation by providing a signal along path 223 to the PPM logic management 220-1. The determination of start and stop cache operations for read operations is not limited by the use of the sense amplifier 209 and the serializer circuitry 207. Other circuits in the data path from memory array 212 to the interface 215 can be used to participate in the PPM of the memory die 205-1.

The PPM logic management 220-1 uses the flags for the write cache operation and the read cache operation as a determination that current is being used in the respective cache operation. The amount of current during the identified cache operation used can be taken to be a fixed amount stored or hardcoded in the PPM logic management 220-1. Alternatively, a lookup table accessed by the PPM logic management 220-1 can be used in which the lookup table has current values based on programmed timing modes or speeds of the data path for the respective write or read cache operation. At the time of the generation of the flags for the cache operation, the value in the lookup table can be selected using the signal from the timing logic 211.

In addition to receiving flags from data paths in cache operations associated with operating the memory array 212, the PPM logic management 220-1 receives information regarding memory array operations from the memory controller 230. Using the received flags and the received information from the memory controller 230, the PPM logic management 220-1 can monitor operations associated with the memory array 212 and the page buffer 208 in write operations and associated with the memory array 212 and the sense amplifier 209 in read operations and calculate total peak power used by the memory array and the respective cache. This total peak power can be calculated in terms of current. Activity associated with a separate reserved current budget for caches by an external user device to the memory device can be avoided.

A cache operation and a memory array operation can be operating at the same time. Since the memory die 205-1 has a constant Vcc provided during operation of the memory die 205-1, the peak current is a parameter to be managed according to a budget. During programming of the memory array 212, pulses are used, which is accompanied by periods of relatively high current and periods of relatively low current. The PPM logic management 220-1 on memory die 205-1, taking into account the total current of cache operations and memory array operations, can use high current peak time and low current peak time to stagger when data is allowed to move in the memory array 212. The PPM logic management 220-1 communicates with the memory controller 230 to control the staggering or pausing in the movement of data in the memory array 212.

The memory controller 230 can include processing circuitry, including one or more processors, and can be configured to perform operations on the memory array 212 by executing instructions 232. The memory controller 230 with the instructions 232 can be structured as firmware for the memory die 205-1 to control functions of the memory array 212. The memory controller 230 can be a dedicated programmable controller to operate as firmware or may be a main memory controller for the memory die 205-1 to execute operations according to instructions 232. Firmware code in the programmable memory controller 230, used to implement array read, erase, and program operations, makes a request to the PPM logic management state machine before entering "high current peak" operations. The PPM logic management 220-1 acknowledges the operation or puts it on hold depending on the overall system current budget, which can include the current budget of other memory dies arranged with the memory die 205-1 in a memory die package. In other examples, at least some portion of the instructions executed by memory controller 230 may be stored in other memory structures and loaded, for example, into local memory of the memory controller 230 for execution. The memory controller 230 waits until it receives a signal to proceed from the PPM logic management 220-1 before executing code in the instructions 232 that cause ICC peaks in memory array operation of the memory die 205-1.

The PPM logic management 220-1 can be constructed with a PPM block to engage in global PPM across multiple memory die packages. The global PPM across multiple memory die packages can be implemented to share peak current budget across the multiple memory die packages. With global PPM, current usage of the multiple memory die packages can be monitored and adjusted in accordance with the variations of peak current budget among the multiple memory die packages. Memory die 205-1 can include a contact pad to provide a path 241-1 to a package contact of the memory die package in which the memory die 205-1 is located. Memory die 205-1 can include another contact pad to provide a path 241-2 to another package contact of the memory die package in which the memory die 205-1 is located. With the memory die 205-1 being NAND memory die, the paths 241-1 and 241-2 can provide paths for ICLK and HC signals. Other memory dies in the memory die package, in which the memory die 205-1 is located, such as memory die 205-N, can be coupled to paths 241-1 and 241-2. These internal bondings to package contacts of the memory die package can provide for PPM communication associated with peak power management among the multiple memory die packages using the package contacts with other memory die packages. Alternatively, ICLK and HC lines can be used within a NAND memory die package and a single communication line to all the memory die packages can be used for global PPM communication with a single contact pad of each memory die of each memory die package coupled to a single package contact of the respective memory die package with each single package contact connected to the single communication line. The single communication line can be provided as a single channel with a multiplexed type of arrangement. A token ring communication can be used for the multiple memory die packages in a manner similar to the token communication among the memory dies within a single memory die package.

Figure 3:
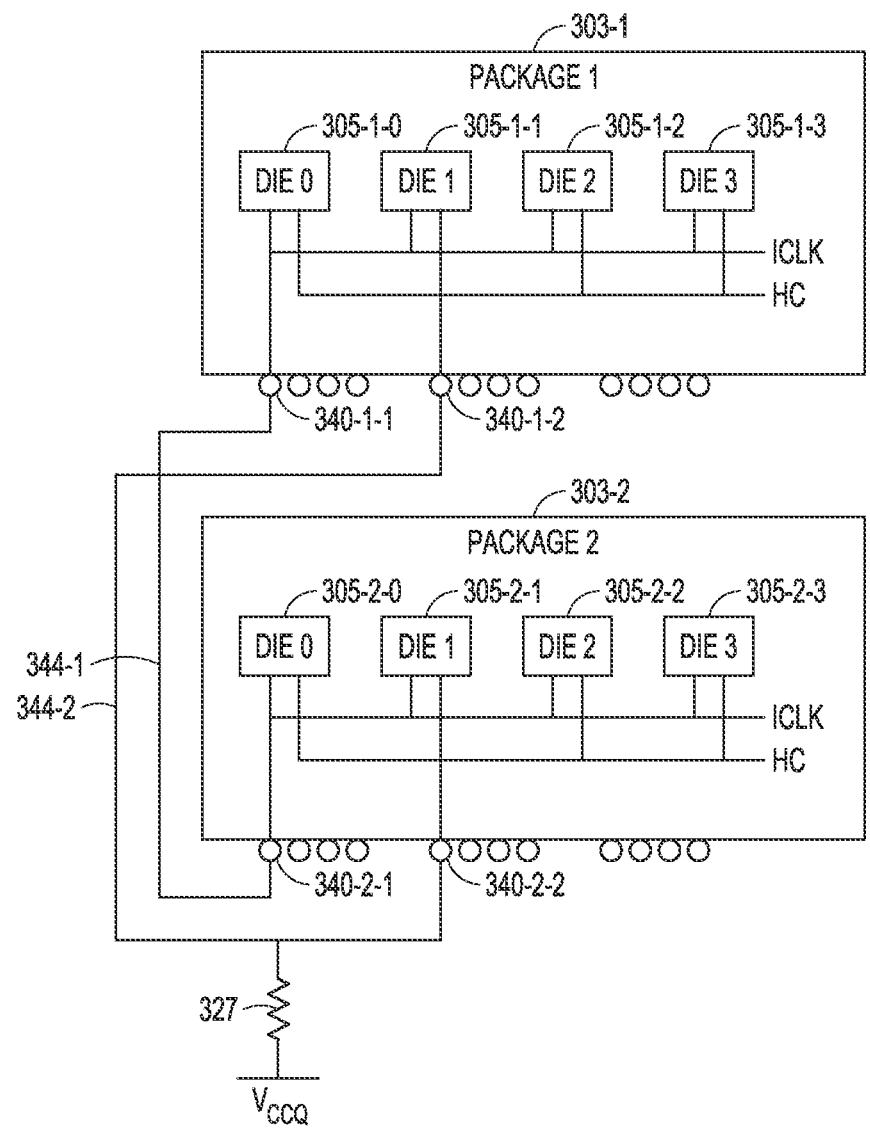
FIG. 3 illustrates an example arrangement of multiple memory die packages coupled to communication lines by package contacts of the multiple memory die packages, in accordance with various embodiments.

FIG. 3 illustrates an embodiment of an example arrangement of multiple memory die packages coupled to communication lines by package contacts of the multiple memory die packages. In the example shown in FIG. 3, a memory die package 303-1 is coupled to a memory die package 303-2 by package contacts 340-1-1 and 340-1-2 of memory die package 303-1 and package contacts 340-2-1 and 340-2-2 of memory die package 303-2 via communication lines 344-1 and 344-2, respectively. The communication line 344-2 can be coupled to supply VCCQ by a pull-up resistor 327. Though two memory die packages are shown, more than two memory die packages can be coupled to implement global PPM across the multiple memory die packages.

The memory die package 303-1 includes memory dies 305-1-0, 305-1-1, 305-1-2, and 305-1-3. The memory die package 303-2 includes memory dies 305-2-0, 305-2-1, 305-2-2, and 305-2-3. Though four memory dies are shown in each of memory die package 303-1 and memory die package 303-2, each of these memory die packages can have one or more memory dies. With the memory dies 305-1-0, 305-1-1, 305-1-2, and 305-1-3 of memory die package 303-1 being NAND memory dies, these memory dies can be internally coupled to an ICLK line and a HC line of memory die package 303-1. The internal lines ICLK and HC can be coupled to package contacts 340-1 and 340-2, respectively, of the memory die package 303-1. With the memory dies 305-2-0, 305-2-1, 305-2-2, and 305-2-3 of memory die package 303-2 being NAND memory dies, these memory dies can be internally coupled to an ICLK line and a HC line of memory die package 303-2. The internal lines ICLK and HC can be coupled to package contacts 340-2-1 and 340-2-2, respectively, of the memory die package 303-2. The internal lines ICLK and HC coupled to the memory dies of both memory die package 303-1 and memory die package 303-2 can be used to provide communication between these memory die packages to implement PPM among these memory die packages. The ICLK and HC output buffers of the memory dies of the memory die packages 303-1 and 303-2 can be tuned to make these output buffers capable of driving signals through these memory die packages.

Figure 4:
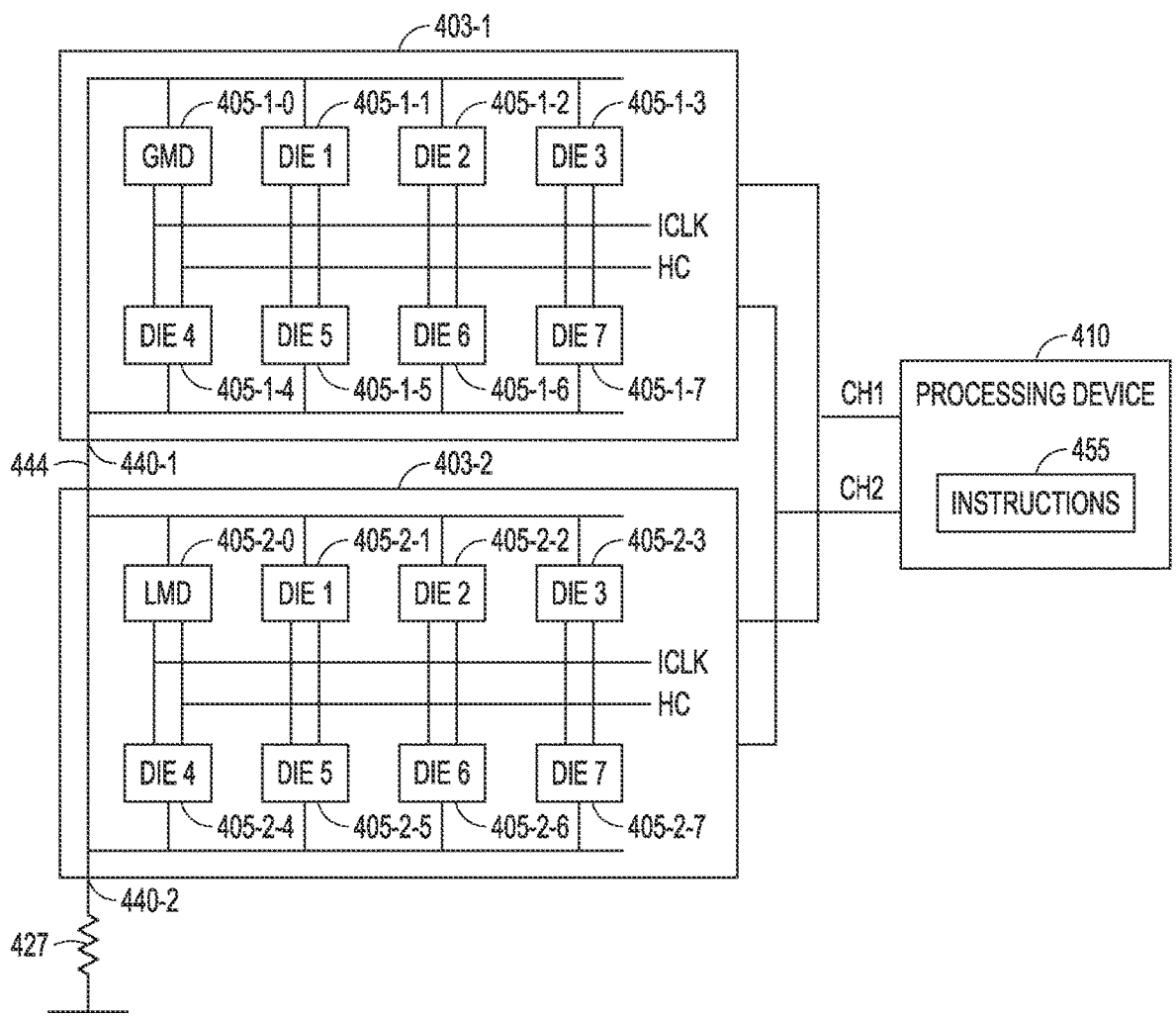
FIG. 4 illustrates an example arrangement of multiple memory die packages coupled to a communication line by package contacts of the multiple memory die packages, in accordance with various embodiments.

FIG. 4 illustrates an embodiment of an example arrangement of multiple memory die packages coupled to a communication line by package contacts of the multiple memory die packages to dynamically share peak current budgets among the multiple memory die packages. FIG. 4 provides an alternative communication line to the communication lines of FIG. 3 for communication among multiple memory die packages. In the example shown in FIG. 4, a memory die package 403-1 and memory die package 403-2 are coupled to a common external resistance 427 by package contact 440-1 of memory die package 403-1 and package contact 440-2 of memory die package 403-2. Though two memory die packages are shown, more than two memory die packages can be coupled to implement PPM across the multiple memory die packages.

The memory die package 403-1 includes memory dies 405-1-0, 405-1-1, 405-1-2, 405-1-3, 405-1-4, 405-1-5, 405-1-6, and 405-1-7. These memory dies can be arranged as two channels. Channel one can include memory dies 405-1-0, 405-1-1, 405-1-2, and 405-1-3 coupled to a processing device 410 operable with instructions 455. Channel two can include memory dies 405-1-4, 405-1-5, 405-1-6, and 405-1-7 coupled to the processing device 410. The processing device 410 can be external to the memory die package 403-1 and can operate as a host to control memory operations with the memory dies on channels one and two in the memory die package 403-1 using instructions 455.

The memory die package 403-2 includes memory dies 405-2-0, 405-2-1, 405-2-2, 405-2-3, 405-24, 405-2-5, 405-2-6, and 405-2-7. These memory dies can be arranged as two channels. Channel one can include memory dies 405-2-0, 405-2-1, 405-2-2, and 405-2-3 coupled to the processing device 410 operable with the instructions 455. Channel two can include memory dies 405-24, 405-2-5, 405-2-6, and 405-2-7 coupled to the processing device 410. The processing device 410 can be external to the memory die package 403-2 and can operate as a host to control memory operations with the memory dies on channels one and two in the memory die package 403-2 using instructions 455.

Though eight memory dies are shown in each of memory die package 403-1 and memory die package 403-2, each of these memory die packages can have one or more memory dies. The memory dies 405-1-0 . . . 405-1-7 of memory die package 403-1 can be coupled to the package contact 440-1. Each one of these memory dies can include a contact pad internally coupled to package contact 440-1 of memory die package 403-1. This contact pad of each memory die of memory die package 403-1 and the package contact 440-1 can be contact pads and package contact dedicated to global PPM communication. Alternatively, this contact pad of each memory die of memory die package 403-1 and the package contact 440-1 can be contact pads and package contact that are implemented for a specified function of the memory dies, where the specified function permits the use of the contact pads and package contact for global PPM communication. The memory dies 405-2-0 . . . 405-2-7 of memory die package 403-2 can be coupled to the package contact 440-2. These memory dies can include a contact pad internally coupled to package contact 440-2 of memory die package 403-2. The contact pad of each memory die of memory die package 403-2 and the package contact 440-2 can be contact pads and package contact dedicated to global PPM communication. Alternatively, the contact pad of each memory die of memory die package 403-2 and the package contact 440-2 can be contact pads and package contact that are implemented for a specified function of the memory dies, where the specified function permits the use of the contact pads and package contact for global PPM communication. Other memory die packages used with memory die packages 403-1 and 403-2 in a global PPM arrangement can be constructed in the same manner.

With the memory die package 403-1 and the memory die package 403-2 configured for PPM across these memory die packages, a memory die in one of memory die package 403-1 and memory die package 403-2 can be set by the processing device 410 to be a GMD. In the example of FIG. 4, memory die 405-1-0 of memory die package 403-1 is the GMD. With the memory die 405-1-0 of memory die package 403-1 being the GMD, memory dies 405-1-1 . . . 405-1-7 of memory die package 403-1 are non-management memory dies. With the GMD in the memory die package 403-1, a memory die in the memory die package 403-2 can be set by the processing device 410 to a LMD. In the example of FIG. 4, memory die 405-1-0 of memory die package 403-1 is the LMD of memory die package 403-1. With the memory die 405-2-0 of memory die package 403-2 being the LMD, memory dies 405-2-1 . . . 405-2-7 of memory die package 403-2 are non-management memory dies. The GMD is responsible for driving a clock signal to the LMD and starting a communication sequence in the memory die package 403-1 and the memory die package 403-2. With the number of memory die packages being N, with N being a positive integer greater than or equal to two, the GMD is responsible for driving a clock signal to N−1 LMDs.

For multiple NAND memory die packages, PPM communication among the NAND memory die packages can be implemented using a ZQ pad of each NAND memory die of the NAND memory die packages. Package contact 440-1 of the memory die package 403-1 and package contact 440-2 of the memory die package 403-2 can be ZQ pads. A ZQ pad of a NAND memory die package is a pad provided for I/O impedance (Z) calibration. The ZQ pads of the memory die package 403-1 and the memory die package 403-2 can be implemented for dual purpose operation. These ZQ pads can be coupled together via a communication line 444 to communicate a global current budget to all NAND memory dies in all the NAND memory die packages to allow sharing a portion of unused current budget. Alternatively, a RB bus can be used to communicate a global current budget to all NAND memory dies in all the NAND memory die packages to allow sharing a portion of unused current budget. An RB bus for a NAND memory die provides a signal for ready/busy output, which indicates the status of the memory die operation. In another alternative, a dedicated contact of each NAND memory die of each NAND memory die package and each package contact of each NAND memory die package can be dedicated connections for communication of global PPM.

Figure 5:
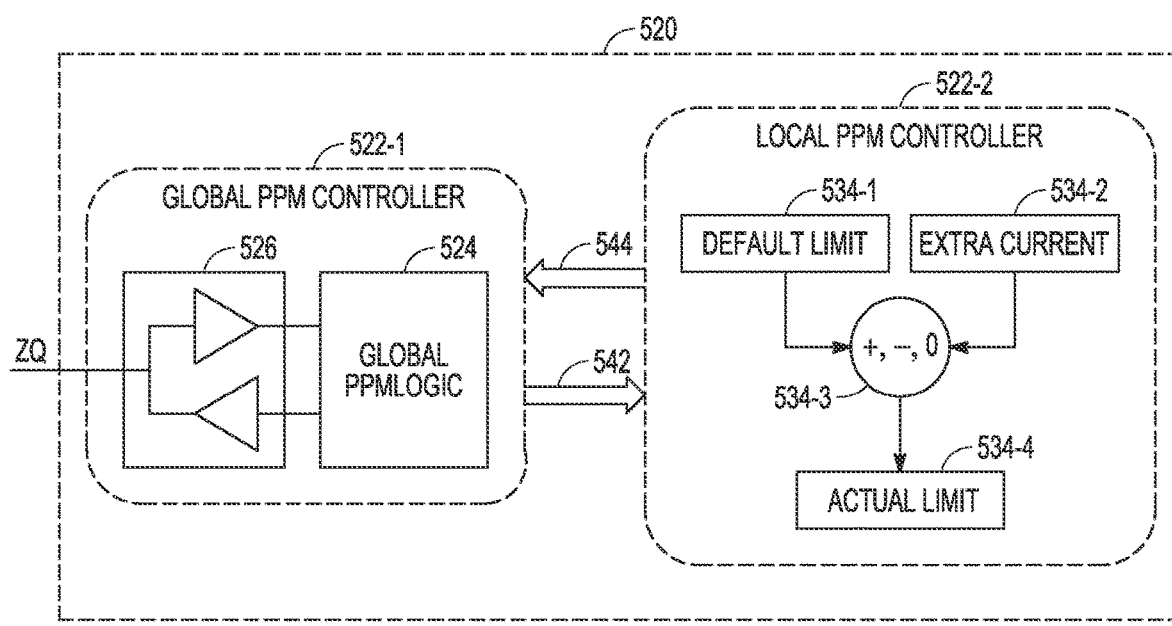
FIG. 5 illustrates an example peak power management block having two controllers to perform power management across multiple packages of memory dies, in accordance with various embodiments.

FIG. 5 illustrates an embodiment of an example PPM block 520 having two PPM controllers to perform power management across multiple packages of memory dies. The two PPM controllers can be a global PPM controller 522-1 and a local PPM controller 522-2. The global PPM controller 522-1 and the local PPM controller 522-2 can be implemented as a single controller with stored instructions in the memory die that control operations in a global PPM controller mode and stored instructions in the memory die that control operations in a local PPM controller mode. The PPM block 520 can be implemented in memory dies similar to memory die 205-1 of FIG. 2 with the global PPM controller 522-1 and the local PPM controller 522-2 of PPM block 520 being part of the controller 222-1 of the PPM logic management 220-1 of memory die 205-1. Alternatively, the PPM block 520 can be implemented in memory dies similar to memory die 205-1 of FIG. 2 with the memory die 205-1 structured without monitoring cache operations using flags received by the PPM logic management 220-1. The PPM block 520 can also be used in the structures shown in FIGS. 1, 3, and 4, where each memory die of the memory die packages in these structures can include a PPM block having the two PPM controllers. The PPM block 520 can be a P-PPM block. With each memory die of a memory die package of multiple die packages constructed in the same manner, any one of the memory dies can be set to be a GMD, a LMD, or a non-management memory die.

The global PPM controller 522-1 in a memory die can interface the PPM block 520 in a memory die package to other memory die packages using a contact pad of the memory die to couple the PPM block 520 to a package contact of the memory die package in which the PPM block 520 is located. The package contact for a NAND memory die package in such arrangement can be a ZQ package contact, a RB package contact, a dedicated package contact, or other appropriate package contact common to the memory dies of the NAND memory die package. The global PPM controller 522-1 can include global PPM logic 524, with the local PPM controller 522-2 structured to handle current budget limits.

With the PPM block 520 as a PPM block of a GMD, the PPM block 520 can use the global PPM controller 522-1 to control global current sharing. The global PPM controller 522-1 can drive a clock pulse and data using IO 526 of a contact pad of the memory die, when the GMD has a token in a token communication protocol among multiple memory die packages. With the PPM block 520 as a PPM block of a LMD, the global PPM controller 522-1 can drive data between clock pulses initiated by the GMD, when the LMD has the token to communicate among multiple memory die packages. The GMD for the multiple memory die packages can listen to all the LMDs in the multiple memory die packages to determine if extra, default, or reduced current budget is available. An alternative approach can be implemented with all memory dies listening to the GMD and all the LMDs in the multiple memory die packages to determine if extra, default, or reduced current budget is available, since all the memory dies in each memory die package have a pad bonded to the same package contact. For example, all memory dies of memory package 403-1 of FIG. 4 have a pad bonded to the package contact 440-1 and all memory dies of memory package 403-2 of FIG. 4 have a pad bonded to the package contact 440-2 contact, with the package contacts 440-1 and 440-2 coupled together. This could save the efforts of the global PPM controller 522-1 providing information to the local PPM controller 522-2 via a path 542 discussed in the following.

The global PPM controller 522-1 communicates with the local PPM controller 522-2 to set actual limits. The global PPM controller 522-1 provides information to the local PPM controller 522-2 via the path 542 and receives results of operation of the local PPM controller 522-2 via path 544. The operation of the local PPM controller 522-2 can include analysis using a default limit 534-1 for a current budget and an extra current 534-2 with a summer 534-3 that adds, subtracts, or does not change the default limit 534-1 for current budget using the extra current 534-2. Consider cases for default limit 534-1 of 1000 mA and extra current 534-2 of 300 mA. For the case with extra current being available, the local PPM controller 522-2 can use the default limit 534-1 plus the extra current 534-2 to provide actual limit 534-4 of 1300 mA for operation of PPM in the memory die package. For the case where another memory die package is using extra current, the local PPM controller 522-2 can use the default limit 534-1 minus the extra current 534-2 to provide the actual limit 534-4 of 700 mA for operation of PPM in the memory die package. For the case where no extra current is available or being used, the local PPM controller 522-2 can use the default limit 534-1 unchanged to keep the actual limit 534-4 of 1000 mA for operation of PPM in the memory die package.

The global PPM controller 522-1 communicates with the local PPM controller 522-2 to interact in a type of PPM controller handshaking mode. The global PPM controller 522-1 reports to the local PPM controller 522-2 if extra, default, or reduced current is available. The local PPM controller 522-2 reports current limit being used to the global PPM controller 522-1. In response to determining that current is available and the memory die package usage is larger than the default limit, for example a current usage going from 1000 mA to 1300 mA, the PPM, such as PPM logic management 220-1 of FIG. 2, can move the actual budget limit to include the extra current limit if there is current budget available. The data in the token communication from the global PPM controller 522-1 can indicate that the memory die package is consuming extra current.

The data can include the digital code '1 1' identifying the status that the memory die package is consuming extra current.

In response to one or more other memory die packages using extra current limit, the memory die package will use a reduced current limit, for example a default limit of 1000 mA minus an extra of 300 to go from 1000 mA to 700 mA. The local PPM controller 522-2 can notify the global PPM controller 522-1 that the local PPM controller 522-2 needs more current. The global PPM controller 522-1 can update other memory die packages to reduce current and wait until confirmation that default current is available. Once confirmed, the global PPM controller 522-1 can update the local PPM controller 522-2 that the limit is now the default limit and the local PPM controller 522-2 can run with the default limit. In response to no extra current being available or being used, the PPM, such as PPM logic management 220-1 of FIG. 2, will use the default limit and operate normally with respect to the memory dies of the memory die package.

Figure 6:
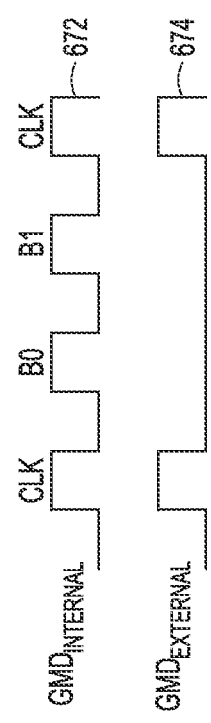
FIG. 6 illustrates example feedback nodes used to feedback a signal to a processing device from memory dies along a feedback connection, in accordance with various embodiments.

FIG. 6 illustrates example signals provided by a global management die for multiple memory die packages. Signal 674 shows a global clock signal provided externally from the GMD. In this example for NAND memory die packages, signal 674 provided by the GMD can include a clock pulse every $3^{rd}$ cycle on the package contact of the memory die package containing the GMD. The package contact can be a ZQ package contact, a RB package contact, a dedicated package contact, or other appropriate package contact common to the memory dies of the NAND memory die package. The signal 674 is not limited to providing a clock pulse every $3^{rd}$ cycle. The signal 674 provided by the GMD can include a clock pulse every Nth pulse. The clock period can be slow, for example approximately 300 ns, though other clock periods can be used. When providing signal 674, the GMD can, for example, generate the clock pulses as two one-shot pulses to all other memory die (except the GMD). Other mechanisms for generating a clock pulses can be used.

FIG. 6 also shows a signal 672 provided internally from the GMD. The internal pulses of signal 672 can drive data between clock pulses of the signal 672 onto an external package contact of the memory die package containing the GMD, when the GMD has the token for communication. In this example for NAND memory die packages, signal 672 provided by the GMD can include a clock pulse every $3^{rd}$ cycle output on a package contact of the memory die package containing the GMD with data pulses B0 and B1 between the clock pulses. The pulses B0 and B1 are data identifying status of current usage of the memory die package containing the GMD. The package contact, such as a ZQ package contact, a RB package contact, a dedicated package contact, or other appropriate package contact common to the memory dies of the NAND memory die package, can be used by the GMD to listen for data from the LMDs of other memory die packages. The data clocked-in from the package contact, when the GMD is listening, identifies the status of current usage of other memory die packages The global token management with respect to the multiple memory die packages can be implemented similar to local token management of an LMD with respect to the memory dies in the memory die package containing the LMD.

Figure 7:
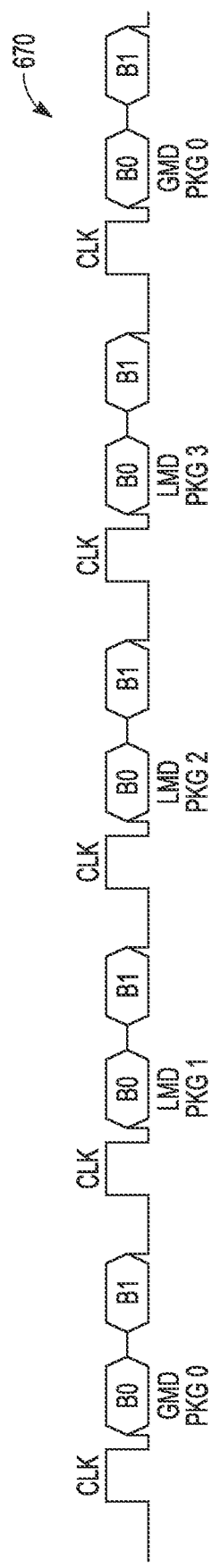
FIG. 7 illustrates an example signal on a communication line among multiple memory die packages for peak power management across the multiple memory die packages, in accordance with various embodiments.

FIG. 7 illustrates an embodiment of an example signal 670 on a communication line among multiple memory die packages for PPM across the multiple memory die packages. The signal 670 can be a round-robin signal in a token communication process. In this example, there are four memory die packages Pkg 0, Pkg 1, Pkg 2, and Pkg 3, with the GMD for these four memory die packages being in Pkg 0. The Pkg 1 includes an LMD; the Pkg 2 includes an LMD; and the Pkg 3 includes an LMD. Though four memory die packages are shown, a signal similar to signal 670 can be used with two or more memory die packages in a PPM arrangement across the multiple memory die packages. With the memory die packages Pkg 0, Pkg 1, Pkg 2, and Pkg 3 being NAND memory die packages, the signal 670 can be propagated from a ZQ package contact, a RB package contact, a dedicated package contact, or other appropriate package contact common to the memory dies of the NAND memory die package.

The GMD of Pkg 0 can initiate the signal during the time that the GMD has token access. For example of FIG. 7, the GMD can generate two one-shot pulses to all other memory dies of Pkg 0 and to all memory dies of Pkg 0, Pkg 1, Pkg 2, and Pkg 3. When the LMD of Pkg 0, Pkg 1, Pkg 2, or Pkg 3 has the token, the LMD of the respective memory die package can drive B0 onto signal 670 after a fixed delay from the GMD clk; drive B1 onto signal 670 after a fixed delay from a first one-shot pulse; and stop driving B1 after a fixed delay from the second one-shot pulse. In this manner, the LMD of each memory die package, not including the GMD, can place data between clock pulses provided by the GMD, where the data identifies current of the respective memory die package. All the non-management memory dies, which are follower memory dies, of all the memory die packages can be in a listening mode.

The data (B0,B1) in the signal 670 identify four states for operation of global PPM among multiple memory die packages. The four states can be idle, run limited, run default, and run extra. The state identified by (B0,B1) equal to (0,0) can indicate an idle state. The idle state indicates that a memory die package is not consuming any current and other memory die in other memory die packages can use more current.

The state identified by (B0,B1) equal to (0,1) can indicate a run limited state. In this state, the memory die package is running at reduced current. This state could immediately trigger other memory die packages that are in a run extra state to reduce current. Alternatively, this state could trigger claiming back to run at a default state, in which case the local group of memory dies of the memory package waits for other memory die packages to finish the token response, such as completing the generation of the (B0, B1) data. For a given memory die package to return to running with the default time from the run limited state, one or more of the other memory die packages need to reduce current to allow such a return to running at the default limit.

The state identified by (B0,B1) equal to (1,0) can indicate a run at default state. In this state, the memory die package is running and using the default current budget. The memory die package in the default state can move to the run extra state, if current budget is available. The state identified by (B0,B1) equal to (1,1) can indicate a run extra state. In the run extra state, the memory die package is consuming extra current beyond the default limit. The local PPM for this memory die package reduces the current budget back to the run default state, if other memory die packages need current. Logic of the local PPM can determine when reduction is needed. The determination can include comparing the number of active memory die running at the extra current limit or the default current limit with the product of the number of memory die packages and the default current limit.

Figure 8:
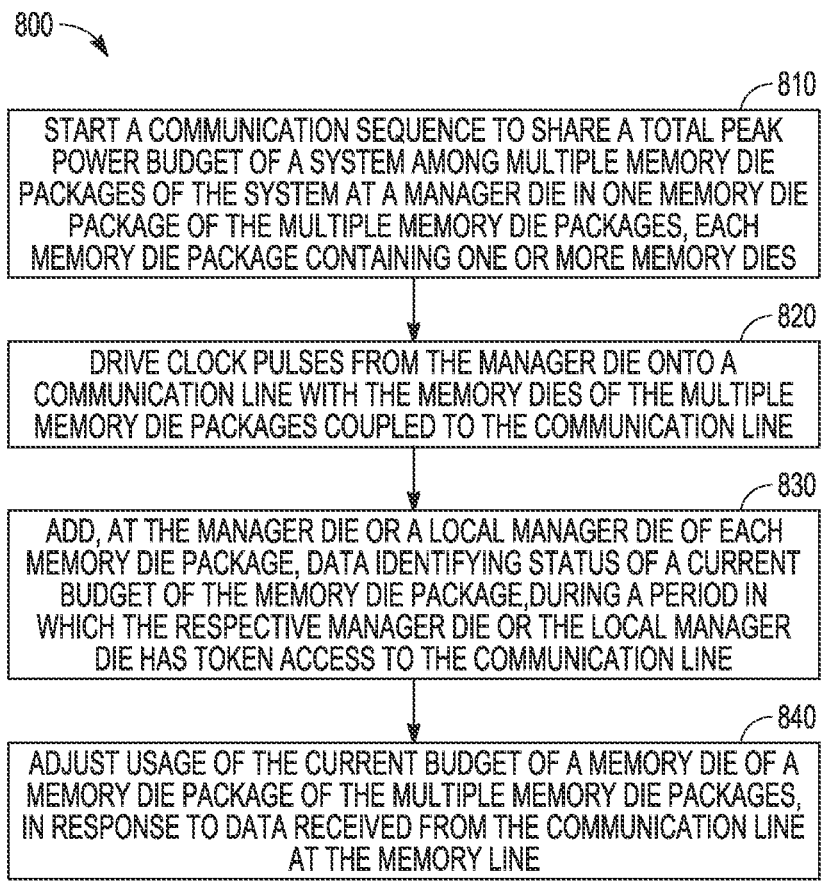
FIG. 8 is a flow diagram of features of an example method of conducting peak power management across multiple memory die packages, in accordance with various embodiments.

FIG. 8 is a flow diagram of features of an embodiment of an example method 800 of conducting peak power management across multiple memory die packages. At 810, a communication sequence is started to share a total peak power budget of a system among multiple memory die packages of the system at a manager die in one memory die package of the multiple memory die packages. Each memory die package of the multiple memory die packages contains one or more memory dies. The total peak power budget can be implemented as a peak current budget. At 820, clock pulses are driven from the manager die onto a communication line with the memory dies of the multiple memory die packages coupled to the communication line. The communication line can be a single channel with a multiplexed type communication to dynamically share the peak current budget across the multiple memory die packages.

At 830, at the manager die or a local manager die of each memory die package, data identifying a status of a current budget of the memory die package is added during a period in which the respective manager die or the local manager die has token access to the communication line. Adding the data identifying status can include adding data between clock pulses, with the data representing a digital code identifying the status.

At 840, usage limit of a current budget of a memory die of a memory die package of the multiple memory die packages is adjusted, in response to data received from the communication line at the memory die. Adjusting the usage limit of the memory die can be performed in response to monitoring the communication line to listen to the local manager die of each memory die package and determining, from the monitoring, availability of extra, default, or reduced current budget. Monitoring the communication line and determining the availability can include using a first controller of the memory die coupled to the communication line. Adjusting the usage limit can be conducted by a second controller of the memory die coupled to receive a report of the availability from the first controller. Adjusting the usage limit of the memory die can include setting the usage limit to a default limit plus a first amount of current, the default limit minus a second amount of current, or to the default limit.

Variations of the method 800 or methods similar to the method 800 can include a number of different embodiments that may be combined depending on the application of such methods and/or the architecture of packaged memory devices in which such methods are implemented. Such methods can include sharing a portion of unused total current budget among the memory dies of the multiple memory die packages.

In various embodiments, a memory die can comprise a first controller including processing circuitry including one or more processors, the first controller configured to perform operations for peak power management. The operations can comprise functioning, in a memory die package of multiple memory die packages, as a global management die for peak power management of the multiple memory die packages, as a local management die within the memory die package, or as a non-management die in the memory die package. Setting of the memory die as a global management die, a local management die, or a non-management die can be accomplished by reception of such an assignment from an external processor and using an identifier in the memory die for the status of the memory die in an arrangement of multiple memory die packages. And with the memory die set as the global management die, starting a communication sequence to share a power budget among the multiple memory die packages. The power budget can be a peak current budget. The memory die can include a contact pad coupled to the first controller to couple the memory die to a package contact of a memory die package in which the memory die can be disposed, where the package contact is configured to provide communication from the first controller to engage in the peak power management of the multiple memory die packages.

With the memory die set as a global management die, the first controller can be operable to drive a digital clock signal from the contact pad, where the digital clock signal includes a clock pulse every Nth pulse such that, between clock pulses, current usage of memory die packages can be provided via pulses in a token communication process. With the memory die set to function as a local management die, the first controller can be operable to output current usage of the memory die package in which the memory die is arranged. With the memory die set to function as a non-management die, the first controller can be operable in a listening mode to receive, from the contact pad, power budget status from the memory die packages.

Variations of such a memory die or similar memory dies can include a number of different embodiments that may be combined depending on the application of such memory dies and/or the architecture in which such memory dies are implemented. Such memory devices can include a second controller including processing circuitry including one or more processors, the second controller configured to perform operations for peak power management of the memory die. The operations of the second controller can comprise: receiving, from the first controller, a report of extra, default, or reduced current being available for the memory die; controlling the peak power management of the memory die using the report; and sending, to the first controller, a local report of a current limit being used in the memory die.

In various embodiments, a memory system can comprise: multiple memory die packages, each memory die package including one or more memory dies; a communication line coupled to each memory die in the multiple memory die packages; a global management die in one memory die package of the multiple memory die packages' and a local management die in each memory die package of the multiple memory die packages other than the memory die package containing the management die. The global management die in the one memory die package can be the local management die of the one memory die package. The global management die is operable to start a communication sequence among the multiple memory die packages to share a current budget across the multiple memory die packages via the communication line. Each local management die is arranged to receive a signal having clock pulses driven by the global management die on the communication line.

The global management die can provide the signal having a clock pulse every Nth cycle and drive data between two clock pulses in response to the global management die having a token for communication. The data can identify status of current usage of the memory die package containing the global management die. The local management die can drive data on the communication line between two clock pulses generated by the global management die, in response to the local management die having a token for communication, where the data identifies status of current usage of the memory die package containing the local management die. The signal can have a clock pulse every third cycle with two data pulses between two clock pulses, where the two data pulses define four states of a current budget of the memory die package. The four states can include idle, reduced current, default current budget, and extra current. The non-management memory dies in the multiple memory die packages can be coupled to the communication line in a listening mode.

Variations of such a memory system or similar memory systems can include a number of different embodiments that may be combined depending on the application of such memory systems and/or the architecture in which such memory systems are implemented. Such memory systems can include the global management die being operable to be set as the global management die of the multiple memory die packages by a memory controller to which the memory system is coupled. Variations can include the communication line coupled to each memory die at a pad of the memory die, with the pad also used in a function of the memory die in addition to peak power management. Variations can include the one or more memory dies in a memory die package being arranged as one or more peak power management groups.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory. ROM, an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 9:
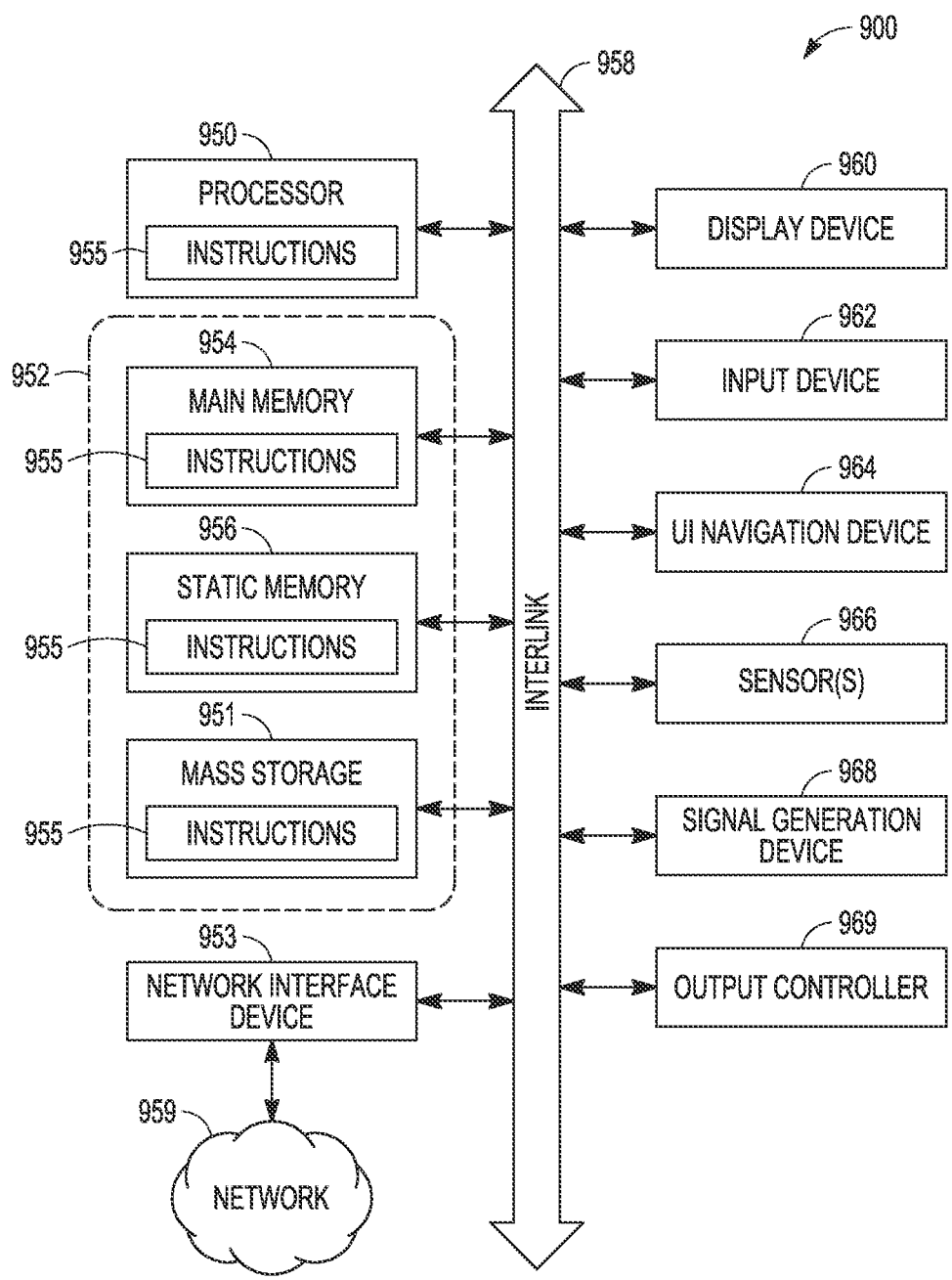
FIG. 9 illustrates a block diagram of an example machine having multiple memory die packages structured with power management across the multiple packages of memory dies, in accordance with various embodiments.

FIG. 9 illustrates a block diagram of an embodiment of an example machine 900 having multiple memory die packages structured with power management across the multiple packages of memory dies. Each memory die can include global and local controllers to engage in PPM across the multiple memory die packages. Each memory die can include a contact pad to couple with a package contact of the memory die package that can be coupled with package contacts of other memory die packages for global PPM among the multiple memory die packages. Controllers for global PPM can execute operations, as taught herein, with respect to but not limited to example embodiments associated with FIGS. 1-8. The machine 900, having one or more such memory devices, may operate as a standalone machine or may be connected, for example networked, to other machines.

In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. The example machine 900 can be arranged to operate with multiple memory die packages configured to engage in PPM across the multiple memory die packages, as taught herein.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 900 may include a hardware processor 950 (e.g., a CPU, a GPU, a hardware processor core, or any combination thereof), a main memory 954, and a static memory 956, some or all of which may communicate with each other via an interlink (e.g., bus) 958. The machine 900 may further include a display device 960, an alphanumeric input device 962 (e.g., a keyboard), and a user interface (UI) navigation device 964 (e.g., a mouse). In an example, the display device 960, input device 962, and UI navigation device 964 may be a touch screen display. The machine 900 may additionally include a mass storage device (e.g., drive unit) 951, a signal generation device 968 (e.g., a speaker), a network interface device 953, and one or more sensors 966, such as a global positioning system (GPS) sensor, compass, accelerometer, or other sensor. The machine 900 may include an output controller 969, such as a serial (e.g., Universal Serial Bus (USB), parallel, or other wired or wireless (e.g., infrared (IR), near field communication (NFC), etc.) connection to communicate or control one or more peripheral devices (e.g., a printer, card reader, etc.).

The machine 900 may include a machine-readable medium 952 on which is stored one or more sets of data structures or instructions 955 (e.g., software) embodying or utilized by the machine 900 to perform any one or more of the techniques or functions for which the machine 900 is designed. The instructions 955 may also reside, completely or at least partially, within the main memory 954, within static memory 956, or within the hardware processor 950 during execution thereof by the machine 900. In an example, one or any combination of the hardware processor 950, the main memory 954, the static memory 956, or the mass storage device 951 may constitute the machine-readable medium 952.

While the machine-readable medium 952 is illustrated as a single medium, the term "machine-readable medium" may include a single medium or multiple media (e.g., a centralized or distributed database, or associated caches and servers) configured to store the one or more instructions 955. The term "machine-readable medium" may include any medium that is capable of storing, encoding, or carrying instructions for execution by the machine 900 and that cause the machine 900 to perform any one or more of the techniques to which the machine 900 is designed, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

The instructions 955 (e.g., software, programs, an operating system (OS), etc.) or other data are stored on the mass storage device 951, can be accessed by the main memory 954 for use by the processor 950. The main memory 954 (e.g., DRAM) is typically fast, but volatile, and thus a different type of storage than the mass storage device 951 (e.g., an SSD), which is suitable for long-term storage, including while in an "off" condition. The instructions 955 or data in use by a user or the machine 900 are typically loaded in the main memory 954 for use by the processor 950. When the main memory 954 is full, virtual space from the mass storage device 951 can be allocated to supplement the main memory 954; however, because the mass storage device 951 is typically slower than the main memory 954, and write speeds are typically at least twice as slow as read speeds, use of virtual memory can greatly reduce user experience due to storage device latency (in contrast to the main memory 954, e.g., DRAM). Further, use of the mass storage device 951 for virtual memory can greatly reduce the usable lifespan of the mass storage device 951.

In contrast to virtual memory, virtual memory compression (e.g., the Linux® kernel feature "ZRAM") uses part of the memory as compressed block storage to avoid paging to the mass storage device 951. Paging takes place in the compressed block until it is necessary to write such data to the mass storage device 951. Virtual memory compression increases the usable size of main memory 954, while reducing wear on the mass storage device 951.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, embedded multi-media controller (eMMC™) devices are attached to a circuit board and considered a component of the host device, with read speeds that rival serial advanced technology attachment (SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

The instructions 955 may further be transmitted or received over a communications network 959 using a transmission medium via the network interface device 953 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 953 may include one or more physical jacks (e.g., Ethernet, coaxial, or phone jacks) or one or more antennas to connect to the communications network 959. In an example, the network interface device 953 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by the machine 900, and includes instrumentalities to propagate digital or analog communications signals to facilitate communication of such instructions, which instructions may be implemented by software.

The following are example embodiments of devices and methods, in accordance with the teachings herein.

An example memory die 1 can comprise: a first controller including processing circuitry including one or more processors, the first controller configured to perform operations for peak power management, the operations comprising: functioning, in a memory die package of multiple memory die packages, as a global management die for peak power management of the multiple memory die packages, as a local management die within he memory die package, or as a non-management die in the memory die package; and with the memory die set as the global management die, starting a communication sequence to share a power budget among the multiple memory die packages; and a contact pad coupled to the first controller to couple the memory die to a package contact of the memory die package, the package contact to provide communication from the first controller to engage in the peak power management among the multiple memory die packages.

An example memory die 2 can include features of example memory die 1 and can include a second controller including processing circuitry including one or more processors, the second controller configured to perform operations for peak power management of the memory die, the operations comprising: receiving, from the first controller, a report of extra, default, or reduced current being available for the memory die; controlling the peak power management of the memory die using the report; and sending, to the first controller, a local report of a current limit being used in the memory die.

An example memory die 3 can include features of any of the preceding example memory dies and can include, with the memory die set as the global management die, the first controller being operable to drive a digital clock signal from the contact pad, the digital clock signal including a clock pulse every Nth pulse such that, between clock pulses, current usage of memory die packages is provided via pulses in a token communication process.

An example memory die 4 can include features of any of the preceding example memory dies and can include, with the memory die set to function as a local management die, the first controller being operable to output current usage of the memory die package in which the memory die is arranged.

An example memory die 5 can include features of any of the preceding example memory dies and can include, with the memory die set to function as a non-management die, the first controller being operable in a listening mode to receive, from the contact pad, power budget status from the memory die packages.

In an example memory die 6, any of the memory dies of example memory dies 1 to 5 may include memory dies incorporated into an electronic memory apparatus further comprising a host processor and a communication bus extending between the host processor and the memory die.

In an example memory die 7, any of the memory dies of example memory dies 1 to 6 may be modified to include any structure presented in another of example memory die 1 to 6.

In an example memory die 8, any apparatus associated with the memory dies of example memory dies 1 to 7 may further include a machine-readable storage device configured to store instructions as a physical state, wherein the instructions may be used to perform one or more operations of the apparatus.

In an example memory die 9, any of the memory dies of example memory dies 1 to 8 may be operated in accordance with any of the methods of the below example methods 1 to 6.

An example memory system 1 can comprise: multiple memory die packages, each memory die package including one or more memory dies; a communication line coupled to each memory die in the multiple memory die packages; a global management die in one memory die package of the multiple memory die packages, the global management die operable to start a communication sequence among the multiple memory die packages to share a current budget across the multiple memory die packages via the communication line; and a local management die in each memory die package of the multiple memory die packages other than the memory die package containing the global management die, each local management die to receive a signal having clock pulses driven by the global management die on the communication line.

An example memory system 2 can include features of example memory system 1 and can include the global management die providing the signal having a clock pulse every Nth cycle and drives data between two clock pulses in response to the global management die having a token for communication, the data identifying status of current usage of the memory die package containing the global management die.

An example memory system 3 can include features of any of the preceding example memory systems and can include the local management die driving data on the communication line between two clock pulses generated by the global management die, in response to the local management die having a token for communication, the data identifying status of current usage of the memory die package containing the local management die.

An example memory system 4 can include features of any of the preceding example memory systems and can include the signal having a clock pulse every third cycle with two data pulses between two clock pulses, the two data pulses defining four states of a current budget of one memory die package of the multiple memory die packages.

An example memory system 5 can include features of any of the preceding example memory systems and can include the four states including idle, reduced current, default current budget, and extra current.

An example memory system 6 can include features of any of the preceding example memory systems and can include non-management memory dies in the multiple memory die packages being coupled to the communication line in a listening mode.

An example memory system 7 can include features of any of the preceding example memory systems and can include the global management die being operable to be set as the global management die of the multiple memory die packages by a memory controller to which the memory system is coupled.

An example memory system 8 can include features of any of the preceding example memory systems and can include the communication line coupled to each memory die at a pad of the memory die, with the pad also used in a function of the memory die in addition to peak power management.

An example memory system 9 can include features of any of the preceding example memory systems and can include the one or more memory dies in a memory die package being arranged as one or more peak power management groups.

In an example memory system 10, any of the preceding example memory systems may include memory systems incorporated into an electronic memory apparatus further comprising a host processor and a communication bus extending between the host processor and the memory system.

In an example memory system 11, any of the preceding example memory systems may be modified to include any structure presented in another of example memory systems 1 to 10.

In an example memory system 12, any of apparatus associated with any of the preceding example memory systems may further include a machine-readable storage device configured to store instructions as a physical state, wherein the instructions may be used to perform one or more operations of the apparatus.

In an example memory system 13, any of the preceding example memory systems may be operated in accordance with any of the methods of the following example methods 1 to 6.

An example memory system 14 can include features of any of the preceding example memory dies 1-9 and memory systems 1-13.

An example method 1 of conducting peak power management can comprise: starting a communication sequence, to share a total peak power budget of a system among multiple memory die packages of the system, at a manager die in one memory die package of the multiple memory die packages, each memory die package containing one or more memory dies; driving clock pulses from the manager die onto a communication line with the memory dies of the multiple memory die packages coupled to the communication line; adding, at the manager die or a local manager die of each memory die package, data identifying a status of a current budget of the respective memory die package, during a period in which the respective manager die or the local manager die has token access to the communication line; and adjusting a usage limit of a current budget of a memory die of a memory die package of the multiple memory die packages, in response to data received from the communication line.

An example method 2 of conducting peak power management can include features of example method 1 of conducting peak power management and can include sharing a portion of unused total current budget among the memory dies of the multiple memory die packages.

An example method 3 of conducting peak power management can include features of any of the preceding example methods of conducting peak power management and can include adding the data identifying the status to include adding data between clock pulses, with the data representing a digital code identifying the status.

An example method 4 of conducting peak power management can include features of any of the preceding example methods of conducting peak power management and can include adjusting the usage limit of the memory die being performed in response to: monitoring the communication line to listen to the local manager die of each memory die package; and determining, from the monitoring, availability of extra, default, or reduced current budget.

An example method 5 of conducting peak power management can include features of example method 4 of conducting peak power management and any of the preceding example methods of conducting peak power management and can include monitoring the communication line and determining the availability to include using a first controller of the memory die coupled to the communication line; and adjusting the usage limit is conducted by a second controller of the memory die coupled to receive a report of the availability from the first controller.

An example method 6 of conducting peak power management can include features of any of the preceding example methods of conducting peak power management and can include adjusting the usage limit of the memory die to include setting the usage limit to a default limit plus a first amount of current, to the default limit minus a second amount of current, or to the default limit.

In an example method 7 of conducting peak power management, any of the example methods 1 to 6 of conducting peak power management may be performed in an electronic memory apparatus further comprising a host processor and a communication bus extending between the host processor and the memory device.

In an example method 8 of conducting peak power management, any of the example methods 1 to 7 of conducting peak power management may be modified to include operations set forth in any other of method examples 1 to 7 of conducting peak power management.

In an example method 9 of conducting peak power management, any of the example methods 1 to 8 of conducting peak power management may be implemented at least in part through use of instructions stored as a physical state in one or more machine-readable storage devices.

An example method 10 of conducting peak power management can include features of any of the preceding example methods 1 to 9 of conducting peak power management and can include performing functions associated with any features of example memory dies 1 to 9 and example memory systems 1 to 14.

An example machine-readable storage device 1 storing instructions, that when executed by one or more processors, cause a machine to perform operations, can comprise instructions to perform functions associated with any features of example memory dies 1 to 9 and memory systems 1 to 14 or perform methods associated with any features of example methods 1 to 10.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A memory die comprising:
  a first controller including processing circuitry including one or more processors, the first controller configured to perform operations for peak power management, the operations comprising:
    functioning, in a memory die package of multiple memory die packages, as a global management die for peak power management of the multiple memory die packages, as a local management die within the memory die package, or as a non-management die in the memory die package; and
    with the memory die set as the global management die, starting a communication sequence to share a power budget among the multiple memory die packages; and
  a contact pad coupled to the first controller to couple the memory die to a package contact of the memory die package, the package contact to provide communication from the first controller to engage in the peak power management among the multiple memory die packages.

2. The memory die of claim 1, wherein the memory die includes a second controller including processing circuitry including one or more processors, the second controller configured to perform operations for peak power management of the memory die, the operations comprising:
  receiving, from the first controller, a report of extra, default, or reduced current being available for the memory die;
  controlling the peak power management of the memory die using the report; and
  sending, to the first controller, a local report of a current limit being used in the memory die.

3. The memory die of claim 1, wherein, with the memory die set as the global management die, the first controller is operable to drive a digital clock signal from the contact pad, the digital clock signal including a clock pulse every Nth pulse such that, between clock pulses, current usage of memory die packages is provided via pulses in a token communication process.

4. The memory die of claim 1, wherein, with the memory die set to function as a local management die, the first controller is operable to output current usage of the memory die package in which the memory die is arranged.

5. The memory die of claim 1, wherein, with the memory die set to function as a non-management die, the first controller is operable in a listening mode to receive, from the contact pad, power budget status from the memory die packages.

6. A memory system comprising:
- multiple memory die packages, each memory die package including one or more memory dies;
- a communication line coupled to each memory die in the multiple memory die packages;
- a global management die in one memory die package of the multiple memory die packages, the global management die operable to start a communication sequence among the multiple memory die packages to share a current budget across the multiple memory die packages via the communication line; and
- a local management die in each memory die package of the multiple memory die packages other than the memory die package containing the global management die, each local management die to receive a signal having clock pulses driven by the management die on the communication line.

7. The memory system of claim 6, wherein the global management die provides the signal having a clock pulse every Nth cycle and drives data between two clock pulses in response to the global management die having a token for communication, the data identifying status of current usage of the memory die package containing the global management die.

8. The memory system of claim 6, wherein the local management die drives data on the communication line between two clock pulses generated by the global management die, in response to the local management die having a token for communication, the data identifying status of current usage of the memory die package containing the local management die.

9. The memory system of claim 6, wherein the signal has a clock pulse every third cycle with two data pulses between two clock pulses, the two data pulses defining four states of a current budget of one memory die package of the multiple memory die packages.

10. The memory system of claim 9, wherein the four states include idle, reduced current, default current budget, and extra current.

11. The memory system of claim 6, wherein non-management memory dies in the multiple memory die packages are coupled to the communication line in a listening mode.

12. The memory system of claim 6, wherein the global management die is operable to be set as the global management die of the multiple memory die packages by a memory controller to which the memory system is coupled.

13. The memory system of claim 6, wherein the communication line is coupled to each memory die at a pad of the memory die, with the pad also used in a function of the memory die in addition to peak power management.

14. The memory system of claim 6, wherein the one or more memory dies in a memory die package are arranged as one or more peak power management groups.

15. A method of conducting peak power management, the method comprising:
- starting a communication sequence, to share a total peak power budget of a system among multiple memory die packages of the system, at a manager die in one memory die package of the multiple memory die packages, each memory die package containing one or more memory dies;
- driving clock pulses from the manager die onto a communication line with the memory dies of the multiple memory die packages coupled to the communication line;
- adding, at the manager die or a local manager die of each memory die package, data identifying a status of a current budget of the respective memory die package, during a period in which the respective manager die or the local manager die has token access to the communication line; and
- adjusting a usage limit of a current budget of a memory die of a memory die package of the multiple memory die packages, in response to data received from the communication line at the memory die.

16. The method of claim 15, wherein the method includes sharing a portion of unused total current budget among the memory dies of the multiple memory die packages.

17. The method of claim 15, wherein adding the data identifying status includes adding data between clock pulses, with the data representing a digital code identifying the status.

18. The method of claim 15, wherein adjusting the usage limit of the memory die is performed in response to:
- monitoring the communication line to listen to the local manager die of each memory die package; and
- determining, from the monitoring, availability of extra, default, or reduced current-budget.

19. The method of claim 18, wherein monitoring the communication line and determining the availability includes using a first controller of the memory die coupled to the communication line, and adjusting the usage limit is conducted by a second controller of the memory die coupled to receive a report of the availability from the first controller.

20. The method of claim 15, wherein adjusting the usage limit of the memory die includes setting the usage limit to a default limit plus a first amount of current, to the default limit minus a second amount of current, or to the default limit.

* * * * *